United States Patent [19]
Wolf

[11] Patent Number: 5,105,146
[45] Date of Patent: Apr. 14, 1992

[54] CURRENT SENSOR AND METHOD FOR DETERMINING THE CURRENT FLOW IN CONDUCTORS TO BE EVALUATED

[75] Inventor: Johann Wolf, Pentling, Fed. Rep. of Germany

[73] Assignee: Simens Aktiengesellschaft, Berlin and Munich, Fed. Rep. of Germany

[21] Appl. No.: 434,518

[22] Filed: Nov. 13, 1989

Related U.S. Application Data

[62] Division of Ser. No. 99,772, Sep. 22, 1987, abandoned.

[30] Foreign Application Priority Data

Sep. 22, 1986 [DE] Fed. Rep. of Germany ....... 3632117

[51] Int. Cl.$^5$ .................... G01R 19/00; G01R 33/02
[52] U.S. Cl. .................... 324/117 R; 324/209
[58] Field of Search .................... 324/117 R, 127, 133, 324/96, 209; 73/763, 775, 862.69, DIG. 2

[56] References Cited

U.S. PATENT DOCUMENTS 4,232,265 11/1980 Smirnov .................... 324/117 R
4,622,460 11/1986 Failes et al. .................... 324/96

FOREIGN PATENT DOCUMENTS 1791011 10/1971 Fed. Rep. of Germany .
0748258 7/1980 U.S.S.R. .................... 324/133

OTHER PUBLICATIONS

Taylor, R.; "Current Sensing Device"; IBM Tech. Dis. Bull.; vol. 11; No. 8; Jan. 1969; p. 917.
Optics Letters, Band 6, No. 1, Jan. 1981, pp. 19-21, Optical Society of America, N.Y., S.C. Rashleigh; "Magnetic-field Sensing with a Single-Mode Fiber".
Journal of Physics E, Band 9, No. 6, Jun. 1976, pp. 451-454; R. D. Greenough et al.; "Strain Gauges for the Measurement of Magnetostriction in the Range 4K to 300K".
Abstract of Japanese Patent No. 56-151361 patented Mar. 2, 1982.

*Primary Examiner*—Ernest F. Karlsen
*Attorney, Agent, or Firm*—Kenyon & Kenyon

[57] ABSTRACT

The invention relates to a current sensor which works with a toroidal body, through which at least one conductor to be evaluated is extended and from which a measuring signal is taken. The toroidal body (1) comprises a magnetostrictive material and conductor runs (2) of length-dependent resistance material are applied over at least one ring region of the toroidal body (1). The resistance changes of the conductor runs are evaluated to determine a value representative of the current (I) to be measured.

2 Claims, 1 Drawing Sheet

CURRENT SENSOR AND METHOD FOR DETERMINING THE CURRENT FLOW IN CONDUCTORS TO BE EVALUATED

This application is a division of application Ser. No. 099,772, filed Sept. 22, 1987, now abandoned.

BACKGROUND AND SUMMARY OF THE INVENTION

The invention relates to a current sensor which works with a toroidal body, through which at least one conductor to be evaluated is extended and from which a measuring signal is taken. Such current sensors are commonly designed ss current-transformers with an iron core or in the form of a Rogowski transformer without iron. Such transformers have complicated winding forms over a toroidal round body, the manufacture of which is costly and time-consuming.

It is an object of the present invention to develop a current sensor for measuring the currents and differential currents free of potential, and which can be manufactured simply and cost-effectively.

According to the invention, the object is achieved through the use of a toroidal body which comprises a magnetostrictive material and conductor runs applied to the toroidal body over at least one ring region. The conductor runs are made from length-dependent resistance material. The resistance change of the conductor runs is evaluated in a manner to determine a value, e.g., a current value, representative of the current in a conductorto be measured.

Such a current sensor has no need for the otherwise required costly pushed-through turns. The primary winding can be constructed in the usual manner from a single or multiple insertion turns. Although wire strain gauges have been known for a long time, they have not been utilized for the design of a simple but relatively accurate current sensor.

It is advantageous to extend the conductor runs of length-dependent resistance material over the entire circumference of the toroidal body in order to eliminate length changes along the toroidal body such as can occur with strong external fields. In order to also keep external field influences on the conductor runs low, it is advantageous to make the conductor runs as loops comprising forward and return conductors. This stimulates bifilar lines.

If a center tap of a loop is brought out as the third terminal in addition to the two end terminals of the loop, partial resistors are obtained which can be used in bridge circuits. Several loops of the conductor runs can also be connected in series.

The invention will now be explained in greater detail, referring to an exemplary embodiment shown schematically in the drawing.

DETAILED DESCRIPTION

Figure 1:
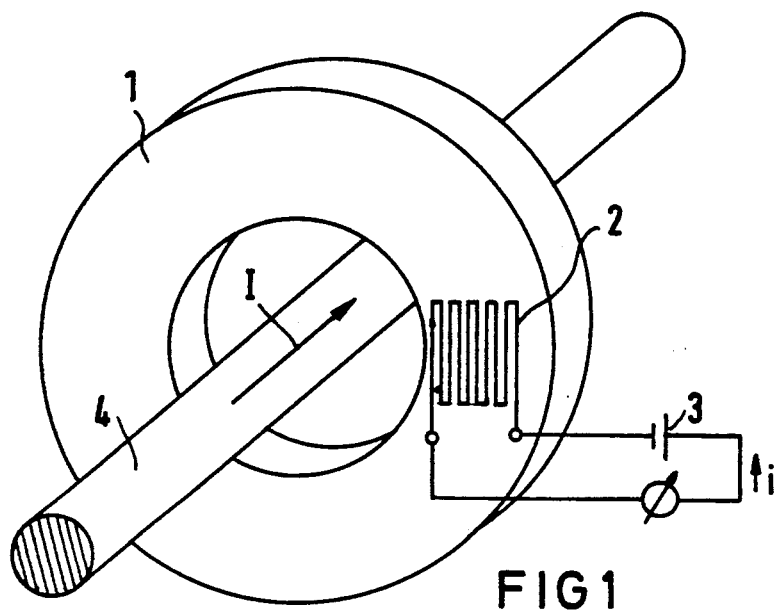
In FIG. 1, the principle of a current sensor is illustrated in a perspective view.

The current sensor according to FIG. 1 works with a toroidal body 1 of magnetostrictive material to which conductor runs 2 of length-dependent resistance material are applied. To these are connected a voltage source or a measuring voltage 3, an ammeter determining the related measuring current i as a measure for the current I in a conductor 4 to be evaluated.

Figure 2:
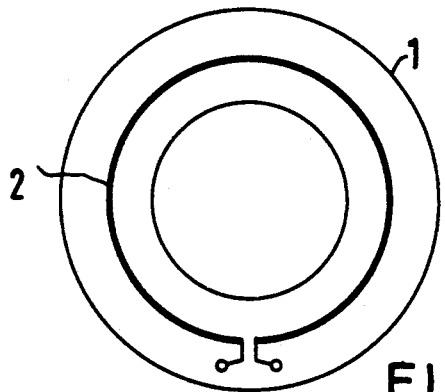
FIG. 2 illustrates a top view of an exemplary embodiment for a toroidal body of the current sensor according to FIG. 1.
Figure 3:
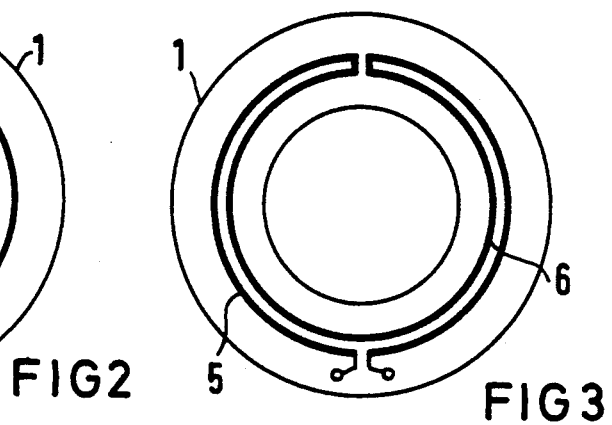
FIG. 3 illustrates a toroidal body according to FIG. 2 with a loop-shaped conductor run.
Figure 4:
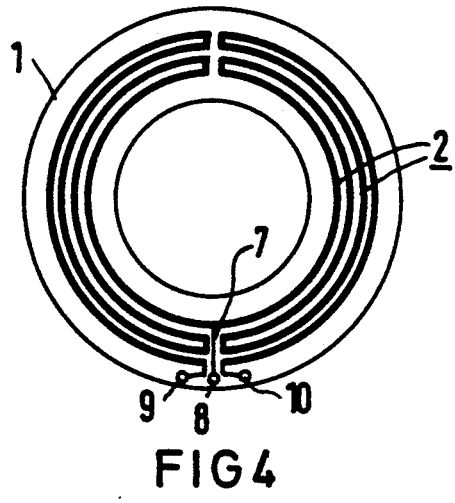
FIG. 4 illustrates a toroidal body according to FIG. 2 with two loops of conductor runs with a center tap.

On the toroidal body according to FIG. 2, a conductor run 2 of length-dependent resistance material is arranged over the entire circumference of the toroidal body. According to FIG. 3, the conductor run which extends over the entire circumference of the toroidal body forms a loop consisting of forward and return conductors 5, 6. Two series-connected loops of conductor runs are provided with a center tap 7 according to FIG. 4. The center tap 7 is brought out as the third terminal 7, in addition to the two other terminals 9 and 10 of the loop.

Figure 5:
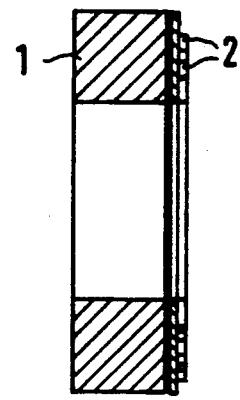
In FIG. 5, the toroidal body according to FIG. 4 is illustrated in a side, cross-sectional view.

The toroidal body 1 has a rectangular cross section in the exemplary embodiment, as can be seen from FIG. 5. The conductor runs 2 are attached to a foil which is cemented to the toroidal body 1.

If a current flows through the conductor 4 to be evaluated as per FIG. 1, the magnetic forces in the magnetostrictive material of the toroidal body 1 cause a change in its circumference. This change in circumference causes a resistance change in the conductor runs 2 of length-dependent resistance material. Thereby, a certain measurement current i is measured by the ammeter if the measuring voltage 3 is applied. The measured current i is a function of the resistance of the length-dependent resistance material. With suitable calibration, the measuring current i is correlated with each current I to be evaluated.

What is claimed is:

1. A current sensor for measuring current flow in a conductor, which comprises:

a toroidal body of magnetostrictive material adapted to surround the conductor;

length-dependent resistance material applied directly to said toroidal body to form an electrical path;

said length-dependent resistance material being arranged and configured so that the electrical path formed by said length-dependent resistance material extends substantially in a circumferential direction relative to said toroidal body through an arc approximately equal to 360°;

a voltage supply coupled to the electrical path formed by said length-dependent resistance material to apply a voltage to the electrical path; and means for measuring an electrical value of the electrical path, which electrical value is a function of the electrical resistance of said length-dependent resistance material;

whereby current flow in the conductor causes the circumference of said toroidal body to change as a function of the current flow so that the length of said length-dependent resistance material changes to thereby change the electrical resistance of the electrical path formed by said length-dependent resistance material;

whereby the electrical value measured by said means for measuring is representative of the current flow through the conductor.

2. A current sensor for measuring current flow in a conductor, which comprises:

a toroidal body of magnetostrictive material adapted to surround the conductor;

length-dependent resistance material applied directly to said toroidal body to form an electrical path;

said length-dependent resistance material being arranged and configured so that the electrical path formed by said length-dependent resistance material extends through loops, each extending generally in a circumferential direction relative to said toroidal body so that current flows through adjacent portions of said loops are opposite to one another;

a voltage supply coupled to the electrical path formed by said length-dependent resistance material to apply a voltage to the electrical path; and means for measuring an electrical value of the electrical path, which electrical value is a function of the electrical resistance of said length-dependent resistance material;

whereby current flow in the conductor causes the circumference of said toroidal body to change as a function of the current flow in the conductor so that the length of said length-dependent resistance material changes to thereby change the electrical resistance of the electrical path formed by said length-dependent resistance material;

whereby the electrical value measured by said means for measuring is representative of the current flow through the conductor.

* * * * *